United States Patent
Lin et al.

(10) Patent No.: US 12,176,188 B2
(45) Date of Patent: Dec. 24, 2024

(54) OPTICAL SPECTRUM SENSOR WAFER OR ROBOT FOR CHAMBER CONDITION MONITORING

(71) Applicant: Applied Materials, Inc., Santa Clara, CA (US)

(72) Inventors: Chuang-Chia Lin, San Ramon, CA (US); Wenwei Qiao, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 17/715,866

(22) Filed: Apr. 7, 2022

(65) Prior Publication Data
US 2023/0326726 A1 Oct. 12, 2023

(51) Int. Cl.
  H01J 37/32 (2006.01)
  B08B 9/46 (2006.01)
  B25J 11/00 (2006.01)
  G01J 3/02 (2006.01)
  G01J 3/10 (2006.01)

(52) U.S. Cl.
  CPC ............ H01J 37/3288 (2013.01); B08B 9/46 (2013.01); B25J 11/0085 (2013.01); G01J 3/0205 (2013.01); G01J 3/10 (2013.01); B08B 2209/08 (2013.01); G01J 2003/102 (2013.01)

(58) Field of Classification Search
  CPC ....... G01J 3/0205; G01J 3/10; G01J 2003/102
  See application file for complete search history.

(56) References Cited

U.S. PATENT DOCUMENTS

| 9,218,944 B2 | 12/2015 | Chandrachood et al. |
| 2003/0169421 A1* | 9/2003 | Ehbets ................. G01J 3/0272 356/406 |
| 2005/0088647 A1 | 4/2005 | Shanmugasundram et al. |
| 2019/0336062 A1 | 11/2019 | Choi et al. |

FOREIGN PATENT DOCUMENTS

KR 1020210072849 A 6/2021

OTHER PUBLICATIONS

International Search Report and Written Opinion from PCT/US2023/014974 dated Jun. 27, 2023, 13 pgs.
International Preliminary Report on Patentability from PCT/US2023/014974 dated Oct. 17, 2024, 8 pgs.

* cited by examiner

*Primary Examiner* — Michael A Lyons
(74) *Attorney, Agent, or Firm* — Schwabe, Williamson & Wyatt, P.C.

(57) ABSTRACT

Embodiments disclosed herein include a diagnostic substrate. In an embodiment, the diagnostic substrate comprises a substrate, a circuit board on the substrate, and a spectrometer coupled to the circuit board. In an embodiment, the diagnostic substrate further comprises a processor on the circuit board and communicatively coupled to the spectrometer.

11 Claims, 9 Drawing Sheets

OPTICAL SPECTRUM SENSOR WAFER OR ROBOT FOR CHAMBER CONDITION MONITORING

BACKGROUND

1) Field

Embodiments relate to the field of semiconductor manufacturing and, in particular, a sensor substrate that includes a spectrometer for measuring surfaces within a chamber.

2) Description of Related Art

In semiconductor manufacturing environments, chambers are typically used to deposit materials onto a substrate, etch materials on a substrate, or treat material layers on a substrate. During the various processing operations, characteristics of the chamber may change. For example, materials may be deposited onto the interior chamber surfaces. In some instances a layer may be a seasoning layer on the interior chamber surface. The seasoning layer may be partially etched or excess material may be deposited on the seasoning layer. That is, it is difficult to maintain the desired process conditions within the chamber. Changes to the interior surfaces of the chamber may result in changes to the processing result of substrates processed in the chamber. As such, it is desirable to monitor the changes to the interior surfaces of the chamber.

In order to monitor the interior surfaces of the chamber, spectrometers and diagnostic substrates can be used. However, spectrometers (e.g., optical emission spectrometer (OES) sensors) are bulky and large instruments that are mounted on the outside of the chamber. The optical path may pass through a window in the chamber. Some diagnostic substrates have also been developed in the past by integrating CMOS or CCD imager on the substrate. However, such diagnostic substrates do not have the ability to monitor optical spectrums. As such, only limited detail of the chamber inner surface or volume can be obtained.

SUMMARY

Embodiments disclosed herein include a diagnostic substrate. In an embodiment, the diagnostic substrate comprises a substrate, a circuit board on the substrate, and a spectrometer coupled to the circuit board. In an embodiment, the diagnostic substrate further comprises a processor on the circuit board and communicatively coupled to the spectrometer.

Embodiments disclosed herein further comprise methods of investigating an interior surface of a processing chamber. In an embodiment, the method comprises inserting a diagnostic device into the processing chamber. In an embodiment, the diagnostic device comprises a spectrometer configured to receive light from a light source that reflects off of an interior surface of the processing chamber and propagates to the spectrometer, and detecting a spectrum with the spectrometer.

Embodiments disclosed herein may further comprise a method of controlling a cleaning and/or a conditioning process of a chamber. In an embodiment, the method comprises initiating a cleaning and/or conditioning process in the chamber. In an embodiment, a diagnostic device is inserted into the chamber. In an embodiment, the diagnostic device is used to determine a material composition and/or a thickness of one or more layers on an interior surface of the chamber. In an embodiment, the method further comprises ending the cleaning and/or conditioning process when the material composition and/or thickness of the one or more layers are at a desired value.

DETAILED DESCRIPTION

Figure 1A:
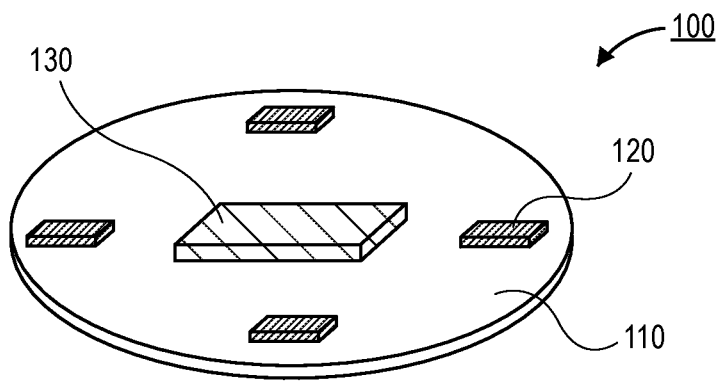
FIG. 1A is a perspective view illustration of a diagnostic device that can be inserted into a chamber to detect information about a chamber lining, in accordance with an embodiment.

Systems described herein include a sensor substrate that includes a spectrometer for measuring surfaces within a chamber. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, careful monitoring of the interior surfaces or volume of a semiconductor processing chamber is necessary in order to maintain tightly controlled processing outputs. However, existing chamber monitoring solutions are limited. External optical emission spectroscopy (OES) sensors include an optical path that passes through a window in the chamber. As such, the location of the chamber that is monitored is limited to the optical path that passes through the window. As such, spatial monitoring within the chamber is not possible. Additionally, in existing diagnostic substrate devices, cameras are used. Such cameras are limited to optical imaging, and are therefore not suitable for detecting layer thicknesses or layer compositions.

Accordingly, embodiments disclosed herein include diagnostic devices that are capable of providing spectral reflectance analysis of interior chamber surfaces as well as providing enhanced detail of the interior chamber layers. This is implemented by using a diagnostic device that includes one or more integrated spectrometers. The spectrometers can detect a spectrum of light that is reflected off of the interior surface of the chamber. Spatial resolution can be obtained by scanning the diagnostic device through the chamber. Other embodiments may include a plurality of light sources in order to provide spatial detail without the need to scan the diagnostic substrate. Unlike optical cameras, the use of spectrometers allows for detailed information about the interior surface layers (e.g., composition, thickness, etc.) to be obtained.

In one embodiment, the diagnostic device may include a wafer like form factor. In such embodiments, the diagnostic device may be inserted and retracted from the chamber using existing robot arms. The diagnostic device may scan the interior surfaces of the chamber as the diagnostic device is inserted and retracted from the chamber. In another embodiment, the diagnostic device may be integrated into the robot arm itself. In such an embodiment, inserting and retracting the robot arm may provide information on interior surface composition, thickness, etc. It is to be appreciated that spectral reflectances obtained by the diagnostic device can be used to determine material composition. For example, different material compositions will have different spectral reflectances that can be used for the material composition determination. Additionally, spectral reflectances can be used to measure layer thicknesses.

In an embodiment, the light source necessary for operation of the spectrometer may be integrated into the diagnostic device. The dedicated light source (or light sources) may be configured to propagate light that reflects off of chamber surfaces and continues to the spectrometer. However, in other embodiments, an external light source may be used to operate the spectrometers. That is, the light source does not need to be integrated directly on the diagnostic device. For example, a plasma within the chamber may be the light source that is used by the spectrometer. In an alternative embodiment, external laser/broadband source can be projected into the chamber through optical fiber or wave guides.

In an embodiment, the diagnostic device may be used periodically in order to monitor the condition of the chamber. For example, the diagnostic device may be inserted after a predetermined number of substrates have been processed in the chamber. In other embodiments, the diagnostic device may be used for continuously monitoring the interior surface of the chamber. Such an embodiment may be particularly beneficial for monitoring chamber conditions during a conditioning and/or cleaning process in the chamber.

Referring now to FIG. 1A, a perspective view illustration of a diagnostic device 100 is shown, in accordance with an embodiment. In an embodiment, the diagnostic device 100 may be provided on a substrate 110. The substrate 110 may have a form factor that is similar to the form factor of wafers processed in the chamber. For example, the substrate 110 may have a diameter of approximately 200 mm or approximately 300 mm. Though, other diameters may also be used for the substrate 110. A thickness of the substrate 110 may be approximately 1 mm in some embodiments. In an embodiment, the substrate 110 may have any suitable material composition. In a particular embodiment, the substrate 110 may comprise silicon. That is, the substrate 110 may be a silicon wafer. However, other embodiments may also be used. For example, the substrate 110 may comprise glass, ceramic, or the like.

In an embodiment, one or more spectrometers 120 may be disposed on a surface of the substrate 110. In the illustrated embodiment, four spectrometers 120 are shown, with one spectrometer 120 in each quadrant of the substrate 110. However, it is to be appreciated that any number of spectrometers 120 may be used, and any suitable arrangement of the spectrometers 120 may be used.

In an embodiment, the spectrometers 120 may be any suitable spectrometer architecture. The spectrometers 120 may be low profile spectrometers. For example, a thickness of the spectrometers 120 may be approximately 5 mm or less, or approximately 1 mm or less. The low profile of the spectrometers 120 allows for the diagnostic device 100 to be inserted into or out of the chamber being monitored with existing robot handling devices (e.g., robot arms or blades). In an embodiment, any spectrometer 120 type that can be fabricated as a low-profile device may be used. For example, the spectrometers 120 may include diffraction and/or a grating type spectrometers, photonic crystal and/or a filter type spectrometers, multi-spectral imager type spectrometers, or interferometer based spectrometers.

In an embodiment, the spectrometers 120 may be communicatively coupled to a processor 130. The processor 130 may be provided at an approximate center of the substrate 110. However, it is to be appreciated that the processor 130 may be provided at any desired location, as will be described in greater detail below with reference to FIGS. 7A-7C. In an embodiment, the process 130 may be communicatively coupled to the spectrometers 120 by any suitable interconnect architecture. In one embodiment, cables or flex circuits (not shown) are provided between the spectrometers 120 and the processor 130. In other embodiments, the spectrometers 120 may be coupled to the process 130 through a printed circuit board (PCB) (not shown).

The processor 130 may include a die suitable for processing the spectrums obtained by the spectrometers 120. The processor 130 may also include functionality in order to control and/or process the data from the spectrometers 120. For example, the processor 130 may dictate to the spectrometers 120 when to collect data. In embodiments with a light source (not shown in FIG. 1A), the processor 130 may also control the light source. The processor 130 may include a memory or use external memory for storing data. In other embodiments, the processor 130 may include a wireless communication interface in order to transmit data (either raw spectrum data or processed data) to an external device.

In the illustrated embodiment, the spectrometers 120 are oriented in a face up position. That is, the spectrometers 120 are oriented to observe light that reflects off a top surface of the chamber. However, it is to be appreciated that other orientations (or a combination of different orientations) may be used in order to detect surface conditions of various surfaces or volume within a chamber. For example, spectrometers 120 may be placed in an orientation in order to look down (e.g., to see a pedestal on which the diagnostic device 200 is placed), or oriented to face out from an edge of the diagnostic device (e.g., to see the sidewalls of the chamber).

Figure 1B:
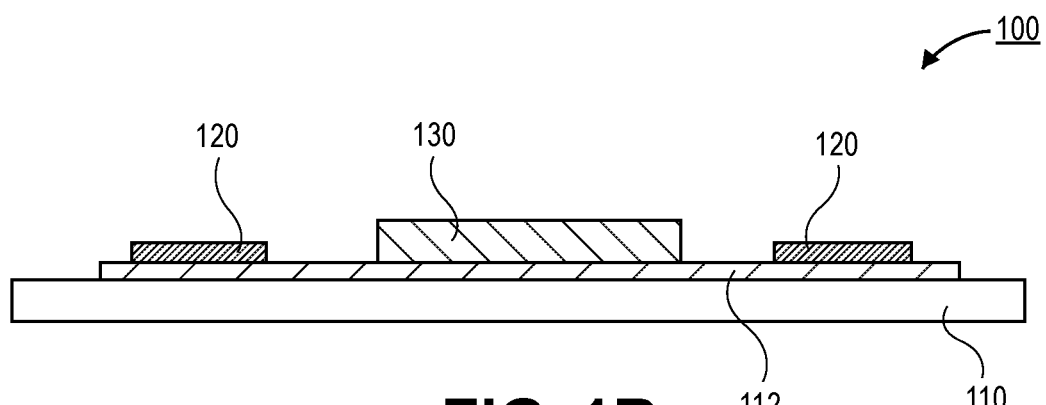
FIG. 1B is a cross-sectional illustration of a diagnostic device with a substrate, a circuit board, spectrometers, and a processor, in accordance with an embodiment.

Referring now to FIG. 1B, a cross-sectional illustration of a diagnostic device 100 is shown, in accordance with an additional embodiment. As shown, the diagnostic device 100 includes a substrate 112. In an embodiment, a PCB 112 may be provided over the substrate 112. The PCB 112 may couple the spectrometers 120 to the processor 130. For example, electrical connections over the PCB 112 may electrically and communicatively couple the processor 130 to the spectrometers 120. While shown as a single PCB 112, it is to be appreciated that the spectrometers 120 and the processor 130 may have distinct PCBs 112. For example, each spectrometer 120 may have a dedicated PCB 112, and the processor 130 may have a dedicated PCB 112. In such an embodiment, the spectrometers 120 may be coupled to the process 130 by a cable or the like, as will be described in greater detail below.

Figure 1C:
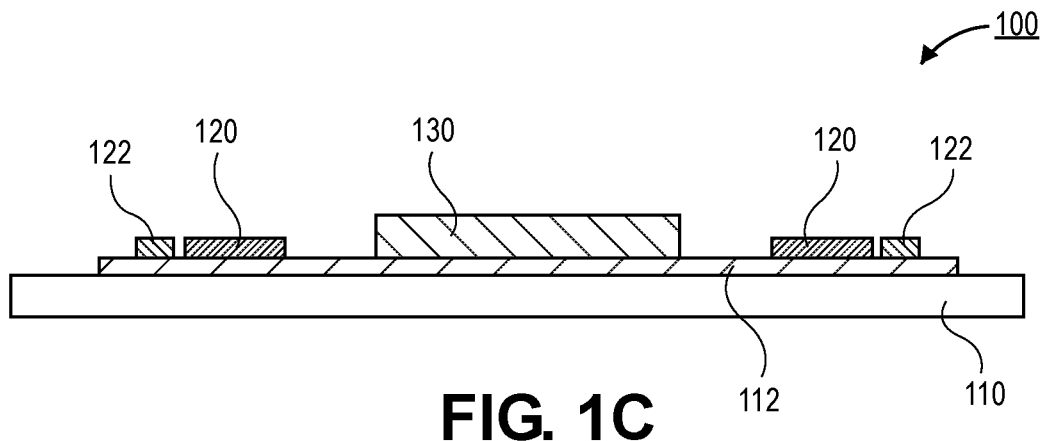
FIG. 1C is a cross-sectional illustration of a diagnostic device with a circuit board, spectrometers, a processor, and light sources, in accordance with an embodiment.

Referring now to FIG. 1C, a cross-sectional illustration of a diagnostic device 100 is shown, in accordance with an additional embodiment. The diagnostic device 100 in FIG. 1C may be substantially similar to the diagnostic device 100 in FIG. 1B, with the exception of the addition of light sources 122. In an embodiment, the light sources 122 may be any suitable light source architecture. In a particular embodiment, the light sources 122 are light emitting diodes (LEDs), though light sources with different spectrums may be included in other embodiments.

In the illustrated embodiment, each spectrometer 120 is adjacent to different light sources 122. In such an embodiment, each spectrometer 120 has a dedicated light source 122. However, in other embodiments, a single light source 122 may be optically coupled to a plurality of spectrometers 120. Such an embodiment will be described in greater detail below. In yet another embodiment, a plurality of light sources 122 may be coupled to a single spectrometer 120. In such embodiments, a spatial analysis of the interior chamber surfaces may be determined without needing to scan the diagnostic device 100 through the chamber. Such an embodiment will be described in greater detail below.

In FIG. 1C, light sources 122 are integrated with the diagnostic device 100. However, it is to be appreciated that embodiments without light sources 122 (e.g., shown in FIG. 1B) may also be used. Such embodiments may use an external light source (e.g., the plasma within a chamber) as the light source in order to operate the one or more spectrometers.

Figure 1D:
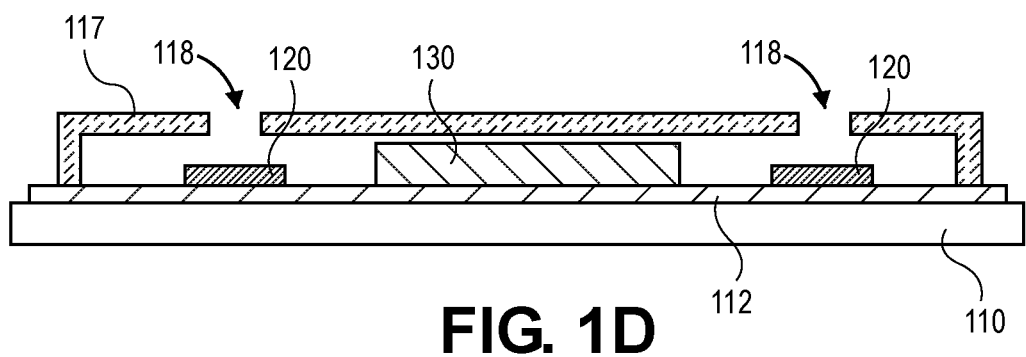
FIG. 1D is a cross-sectional illustration of a diagnostic device with a lid over the components, in accordance with an embodiment.

Referring now to FIG. 1D, a cross-sectional illustration of a diagnostic device 100 is shown, in accordance with an additional embodiment. As shown, the diagnostic device 100 may include a cover 117. The cover 117 may be used to protect underlying components of the diagnostic device 100 from the plasma environment. In an embodiment, openings 118 may be provided through the cover 117 in order to allow reflected light (e.g., from the plasma itself, from an external light source, or a light source internal to the diagnostic device) to reach the spectrometers 120.

Figure 2:
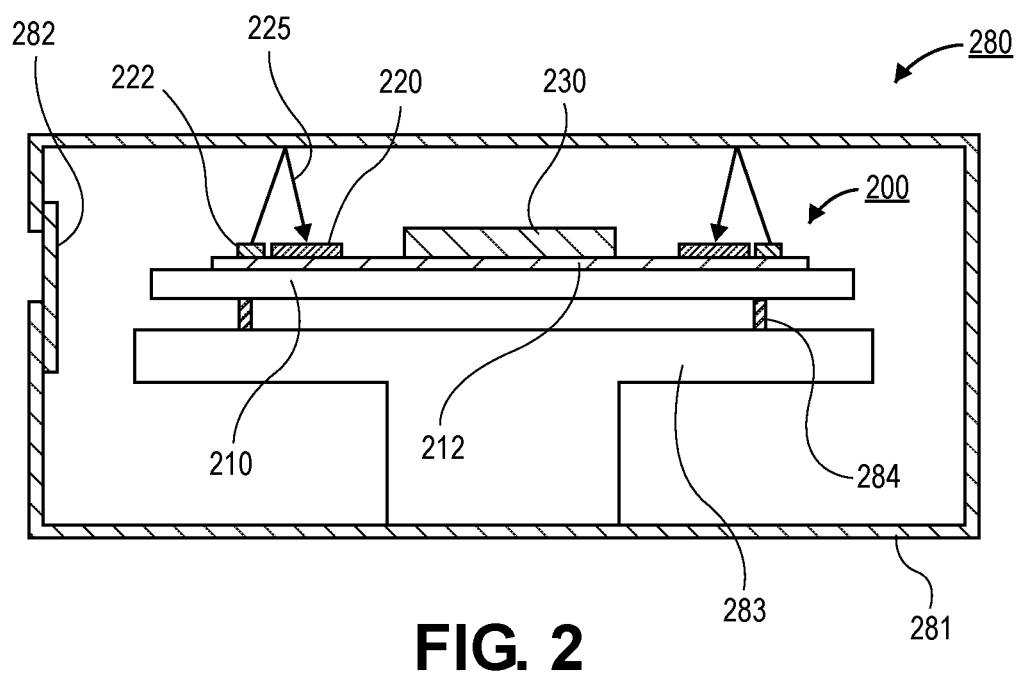
FIG. 2 is a cross-sectional illustration of a diagnostic device inserted into a chamber to detect interior surface conditions of the chamber, in accordance with an embodiment.

Referring now to FIG. 2, a cross-sectional illustration of a semiconductor processing chamber 280 is shown, in accordance with an embodiment. In an embodiment, the chamber 280 may include a chamber body 281. The chamber body 281 may include an enclosure for processing semiconductor substrates (e.g., wafers) or the like. In the illustrated embodiment, the chamber body 281 is shown as a substantially monolithic chamber. However, it is to be appreciated that plasma processing chambers 280 may include separate components to fabricate the chamber body 281. For example, a lid may be provided as a distinct component from sidewalls of the chamber body 281. In an embodiment, the chamber body 281 may comprise a slit valve door 282 or the like. Substrates (e.g., processing substrates or a diagnostic device 200) may be inserted into the chamber body 281 when the slit valve door 282 is opened.

In an embodiment, the chamber 280 may be any chamber suitable for processing semiconductor substrates or other substrates useful in the semiconductor manufacturing context. For example, the chamber 280 may be a plasma chamber, such as a plasma deposition or a plasma etching chamber. In other embodiments, the chamber 280 may be a chemical vapor deposition (CVD) chamber, an atomic layer deposition (ALD) chamber, a physical vapor deposition (PVD) chamber, a thermal treatment chamber (e.g., a rapid thermal processing (RTP) chamber), or any other processing chamber used in semiconductor processing environments. In an embodiment, the chamber 280 may be one chamber in a cluster tool. That is, a plurality of chambers 280 may be coupled together through a central chamber.

In the illustrated embodiment, the diagnostic device 200 is provided on lift pins 284. The lift pins 284 may be at a position to receive the diagnostic device 200 off of a robot arm (not shown in FIG. 2). The lift pins 284 may support the diagnostic device 200 and lower the diagnostic device 200 onto a surface of the pedestal 283.

In an embodiment, the diagnostic device 200 may be similar to any of the diagnostic devices described in detail herein. For example, the diagnostic device 200 may comprise a substrate 210. The substrate 210 may have a form factor similar to a silicon wafer (e.g., a diameter of 200 mm or 300 mm). In an embodiment, a PCB 212 may be provided over the substrate 210. The PCB 212 may include circuitry in order to electrically and communicatively couple the spectrometers 220 and the light sources 222 to the processor 230. While shown as having light sources 222, it is to be appreciated that the light sources 222 may be omitted in favor of an external light source (e.g., a plasma).

In the illustrated embodiment, each light source 222 is optically coupled to one of the spectrometers 220. As used herein, optically coupled may refer to an optical path 225 that initiates at a first component and ends at a second component. For example, optical paths 225 start at the light sources 222, reflect off of the interior surface of the chamber body 281, and end at the spectrometers 220. In the configuration shown in FIG. 2, the condition of the interior surface of the chamber body 281 (e.g., material composition of a layer on the interior surface of the chamber body 281, thickness of one or more layers over the interior surface of the chamber body 281, etc.) may be determined at a plurality of discrete locations. The number of discrete locations may be equal to the number of spectrometers 220 provided on the diagnostic device 200. That is, the spectrometers 220 detect a spectrum from the light sources 222. The spectrum may be analyzed in order to determine material compositions, thicknesses, and the like of layers over the interior surface of the chamber body 281.

While the chamber condition at a plurality of discrete locations is possible, it is to be appreciated that scanning the diagnostic device through the chamber body 281 can provide a spatial analysis of the interior surfaces of the chamber body 281. An example of such an embodiment is shown in FIGS. 3A and 3B.

Figure 3A:
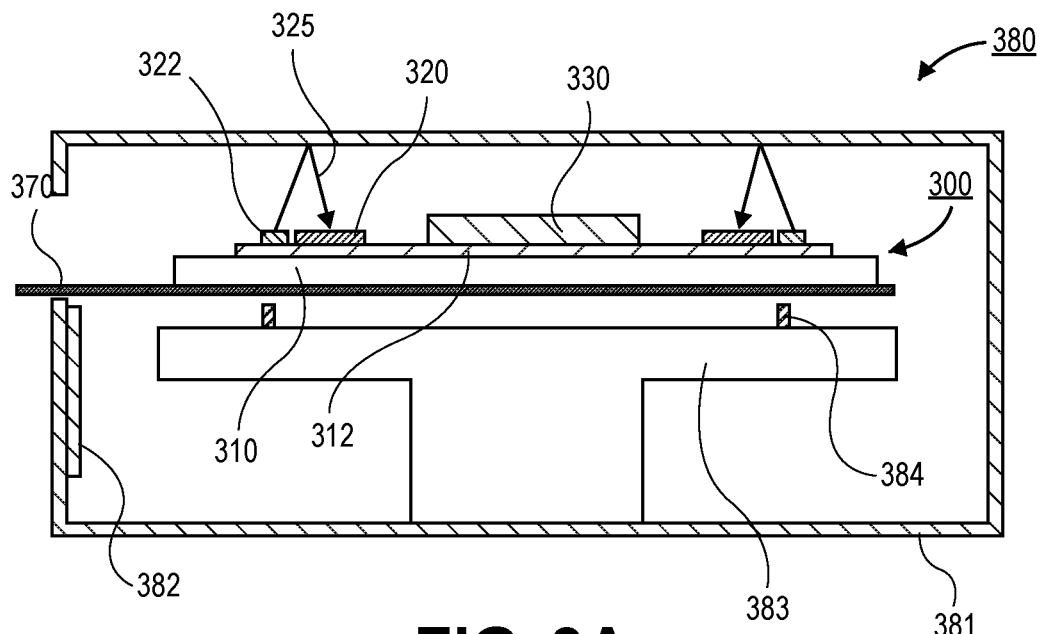
FIG. 3A is a cross-sectional illustration of a diagnostic device on a robot arm inserted into the chamber, in accordance with an embodiment.

Referring now to FIG. 3A, a cross-sectional illustration of a semiconductor processing chamber 380 is shown, in accordance with an embodiment. The chamber 380 may be substantially similar to the chamber 280 described in detail above. For example, the chamber 380 may comprise a chamber body 381 with a slit valve door 382. A pedestal 383 and lift pins 384 may also be included. As shown in FIG. 3A, the slit valve door 382 is open and a robot arm 370 is supporting the diagnostic device 300 above the pedestal 383.

In an embodiment, the diagnostic device 300 may be similar to any of the diagnostic devices described herein. In a particular embodiment, the diagnostic device 300 includes a substrate 310. The substrate 310 may have a wafer form factor. In an embodiment, a PCB 312 is provided over the substrate 310. A processor 330, a plurality of spectrometers 320, and a plurality of light sources 322 may be provided on the PCB 312. In an embodiment, the light sources 322 are optically coupled to the spectrometers 320. For example, optical path 325 starts at one of the light sources 322, reflects off of the chamber body 381, and ends at one of the spectrometers 320.

Figure 3B:
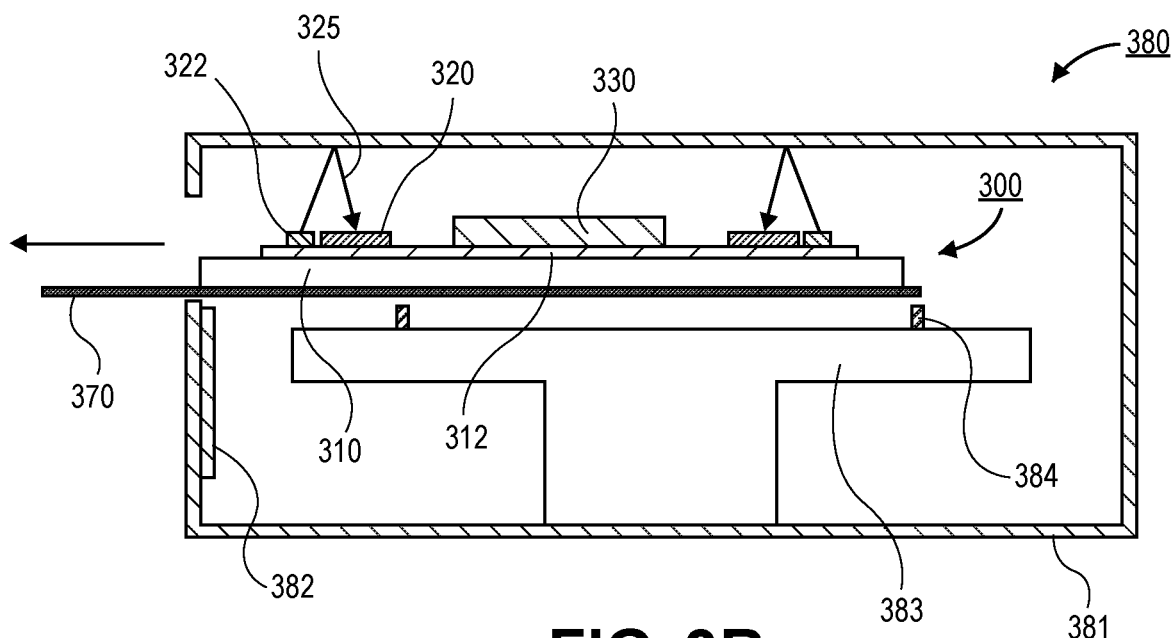
FIG. 3B is a cross-sectional illustration of the diagnostic device being retracted out of the chamber by a robot arm, in accordance with an embodiment.

Referring now to FIG. 3B, a cross-sectional illustration of the chamber 380 during the scanning of the diagnostic device 300 is shown, in accordance with an embodiment. As shown by the arrow, the robot arm 370 is retracting the diagnostic device 300 out of the chamber body 381. During the lateral displacement of the diagnostic device 300, the processor 330 initiates the light sources 322 and the spectrometers 320. As such, a spatial analysis of the top surface of the chamber body 381 (e.g., a lid) may be obtained with the diagnostic device 300. In an embodiment, the spatial analysis may provide the material composition of one or more layers on the interior surface of the chamber body 381 and/or thicknesses of the one or more layers on the interior surface of the chamber body 381.

While shown in a face-up orientation, it is to be appreciated that face-down orientations (e.g., to monitor the pedestal 383) or face-out orientations (e.g., to monitor the sidewalls of the chamber body 381) may also be used. Additionally, a combination of face-up, face-down, and/or face-out orientations may be used in order to monitor multiple interior surfaces of the chamber 380 in other embodiments.

In the embodiments described above with respect to FIGS. 3A and 3B, a scanning of the diagnostic device 300 (by moving the substrate within the chamber 380) is described. However, it is to be appreciated that embodiments may provide spatial analysis of the interior of the chamber without requiring movement of the diagnostic device. An example of such an embodiment is provided in FIG. 4.

Figure 4:
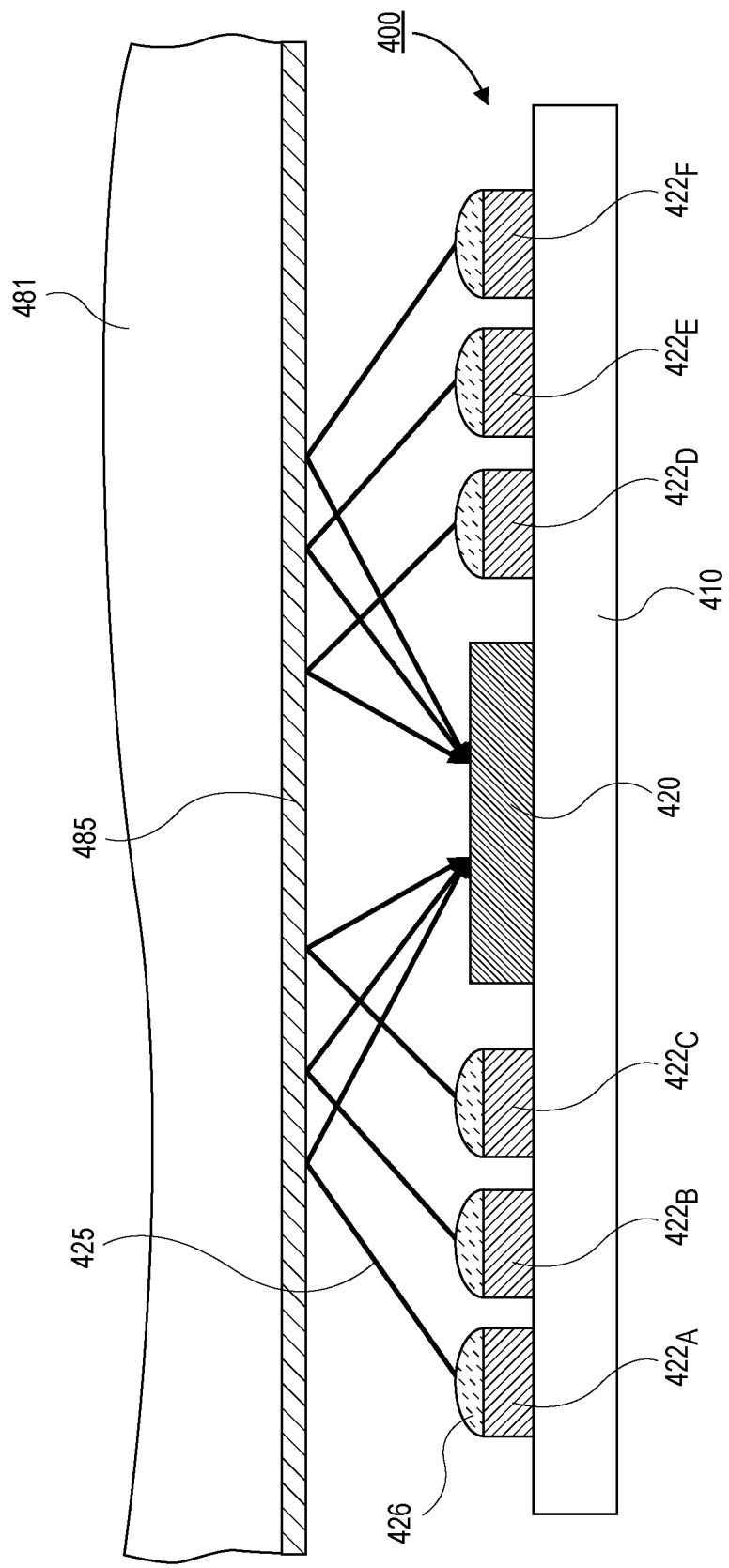
FIG. 4 is a cross-sectional illustration of a diagnostic device with a plurality of light sources in order to provide a multi-point analysis of the interior chamber surface, in accordance with an embodiment.

Referring now to FIG. 4, a cross-sectional illustration of a diagnostic device 400 inside a chamber body 481 is shown, in accordance with an embodiment. In an embodiment, the chamber body 481 may be similar to any of the chamber bodies described in greater detail above. In a particular embodiment, a layer 485 may be deposited on an interior surface of the chamber body 481. The layer 485 may be a conditioning layer, or may be the result of deposition of byproducts of a processing operation (e.g., etch byproducts, redeposition, etc.) While shown as a single layer 485, it is to be appreciated that multiple layers of different materials may also be included as part of the layer 485.

In an embodiment, the diagnostic device 400 may be supported by a pedestal or lift pins (not shown). In other embodiments, the diagnostic device 400 may remain supported by the robot arm. In an embodiment, the diagnostic device 400 may include a substrate 410. The substrate 410 may have a wafer form factor. In an embodiment, a spectrometer 420 is shown on the substrate 410. While shown as being directly on the substrate 410, in other embodiments, the spectrometer 420 may be on a PCB or the like.

In an embodiment, a plurality of light sources 422A-F may be provided on the substrate 410 (or optionally on a PCB). In an embodiment, the light sources 422 may each be optically coupled to the single spectrometer 420. For example, optical paths 425 start at each of the light sources 422, reflect off of different locations on the layer 485, and end at the spectrometer 420. As such, a plurality of locations across the layer 485 may be analyzed without needing to laterally move the diagnostic device 400. Each of the light sources 422 may include a lens 426 to focus the light so that the optical paths 425 end at the spectrometer 420. In the illustrated embodiment, six light sources 422 are shown. However, it is to be appreciated that any number of light sources 422 (e.g., two or more light sources 422) may be used in order to provide spatial analysis of the layer 485.

Similar to embodiments described above, the spectrometers 420 may be provided in different orientations in order to monitor different surfaces of the chamber body 481. For example, a combination of face-up, face-down, and face-out spectrometer 420 orientations may be used to determine surface properties of the lid, the sidewalls of the chamber body 481, and/or the pedestal.

Figure 5:
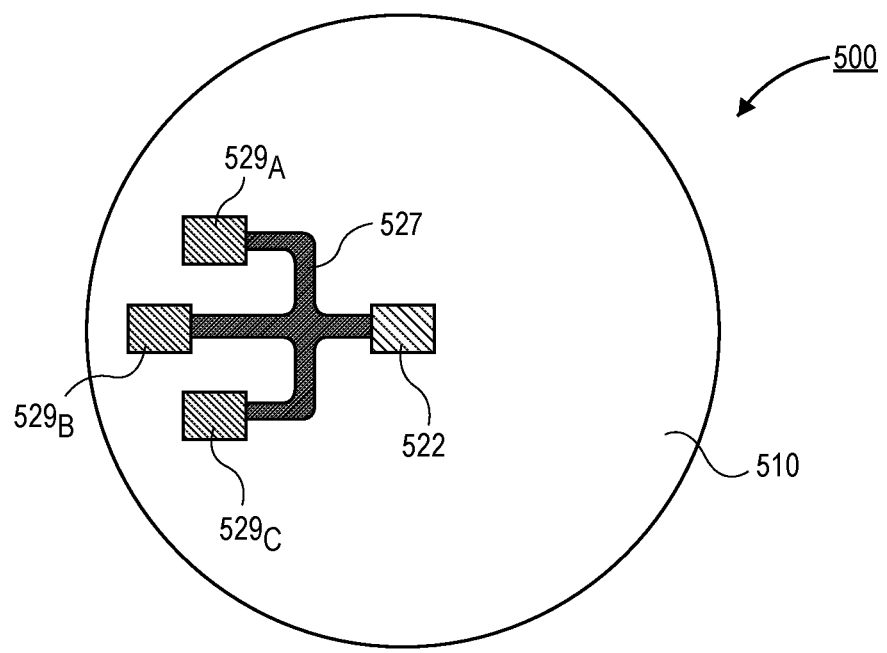
FIG. 5 is a plan view illustration of a diagnostic device with a single light source that is coupled to a plurality of repeaters by optical waveguides, in accordance with an embodiment.

Referring now to FIG. 5, a plan view illustration of a diagnostic device 500 is shown, in accordance with an additional embodiment. As shown, the diagnostic device 500 includes a substrate 510. The substrate 510 may have a wafer form factor, similar to embodiments described in greater detail above. In the illustrated embodiment, only the light source 522 and a set of repeaters 529 are shown for simplicity. However, the diagnostic device 500 may also include spectrometers and a processor, similar to embodiments described above.

In an embodiment, a single light source 522 may be used in order to feed light to a plurality of repeaters 529. For example, three repeaters $529_{A-C}$ are shown in FIG. 5. Each of the repeaters 529 may be coupled to different spectrometers. In other embodiments, multiple repeaters 529 may be coupled to a single spectrometer. In an embodiment, the repeaters 529 are optically coupled to the light source 522 by optical waveguides 527. The repeaters 529 may include a lens or the like in order to optically couple with the spectrometers. While three repeaters $529_{A-C}$ are shown in FIG. 5, it is to be appreciated that light source 522 may feed any number of repeaters 529.

Figure 6:
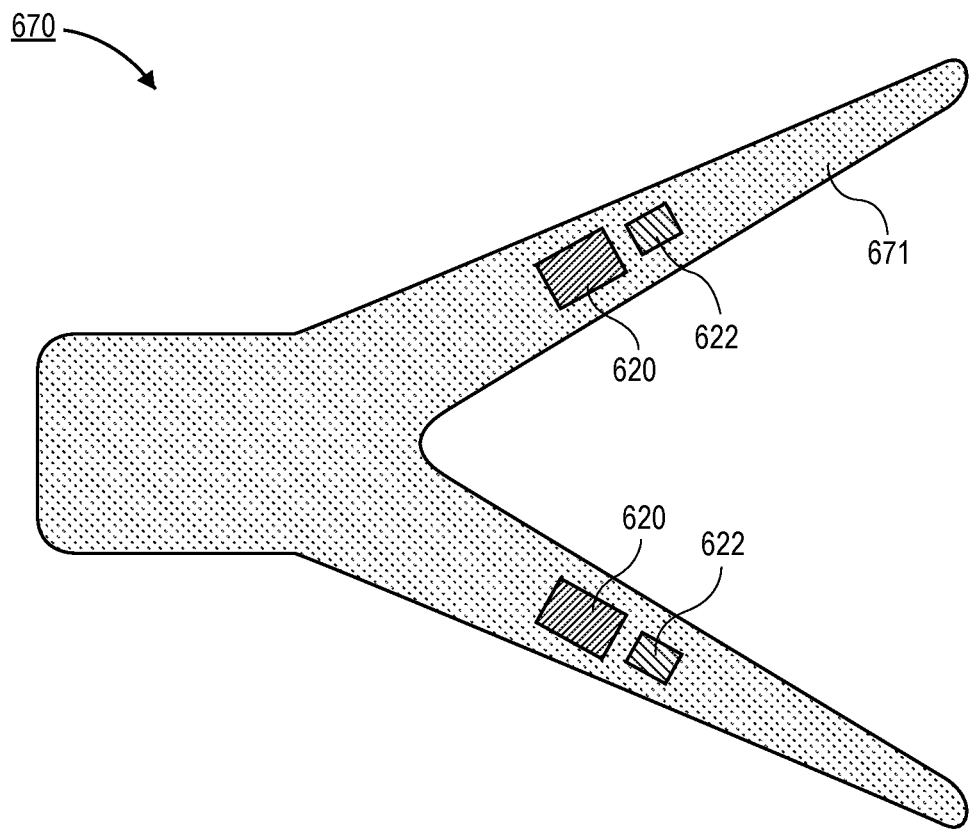
FIG. 6 is a plan view illustration of a diagnostic device that is integrated into a robot arm, in accordance with an embodiment.

Referring now to FIG. 6, a plan view illustration of a diagnostic device 670 is shown, in accordance with yet another embodiment. Instead of being integrated on a standalone substrate, the diagnostic device 670 is integrated with the robot arm 671. For example, one or more spectrometers 620 may be provided on the robot arm 671. Additional embodiments may include the presence of one or more light sources 622. However, external light sources may also be used in some embodiments.

Integrating the diagnostic device 670 with the robot arm 671 is beneficial because a dedicated substrate is not needed to analyze the interior surface of the chamber. Instead, the robot arm 671 may be displaced within the chamber without supporting a substrate. Similar to embodiments described above, the spectrometers 620 may be in a face-up, face-down, or face-out orientation.

Figure 7A:
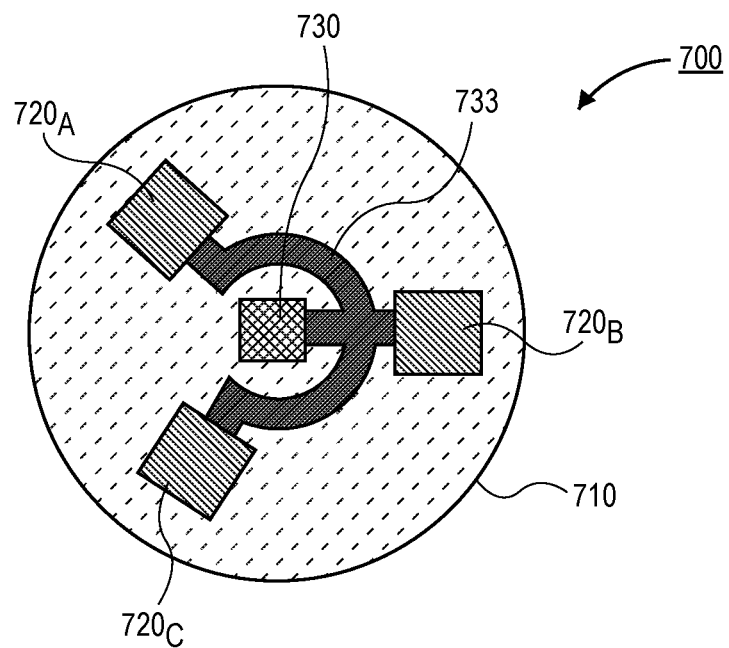
FIGS. 7A-7C are plan view illustrations of diagnostic devices that illustrate various ways that spectrometers are coupled to the processor, in accordance with an embodiment.
Figure 7B:
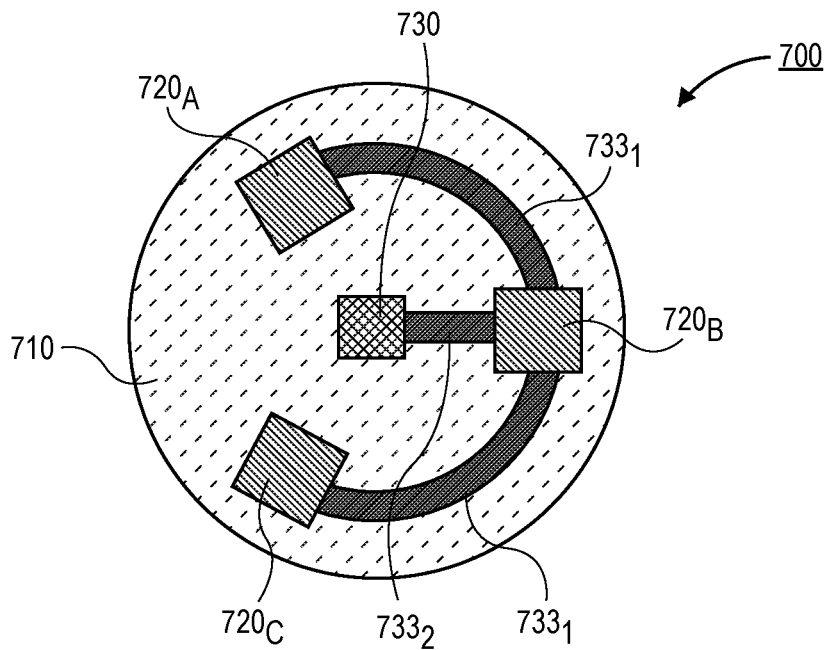
Figure 7C:
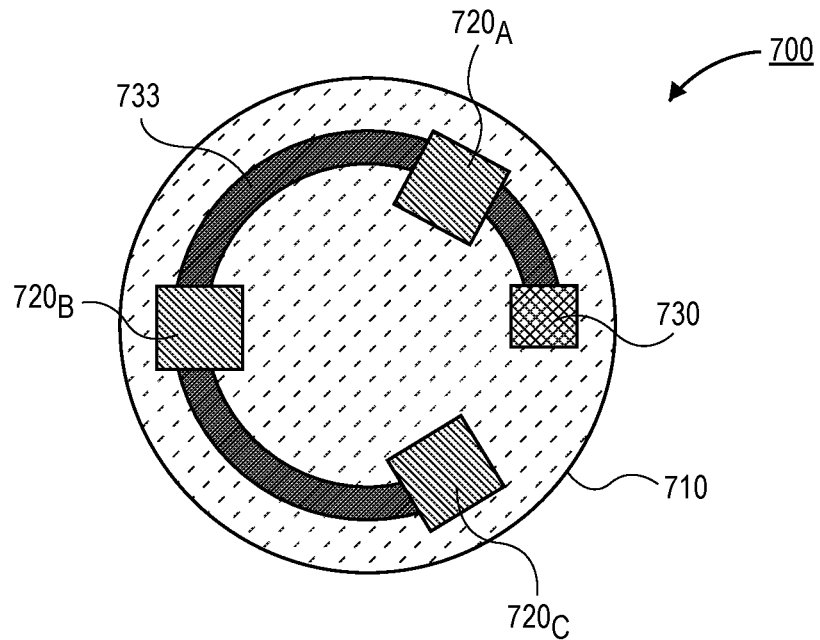

Referring now to FIGS. 7A-7C, a series of plan view illustrations depicting architectures for communicatively coupling the spectrometers 720 to a processor 730 is shown in accordance with an embodiment.

Referring now to FIG. 7A, a plan view illustration of a diagnostic device 700 is shown, in accordance with an embodiment. The diagnostic device 700 may comprise a substrate 710. A plurality of spectrometers 720$_{A-C}$ may be communicatively coupled with a processor 730 in star-like network. In an embodiment, the spectrometers 720$_{A-C}$, identical to each other, may be coupled to the processor 730 by a cable 733. The cable 733 may be a single cable 733 that connects to each of the components.

Referring now to FIG. 7B, a plan view illustration of a diagnostic device 700 is shown, in accordance with an embodiment. Instead of a single cable 733, a set of three cables 733 are provided. Two first cables 733$_1$ connect the three spectrometers 720$_{A-C}$ together, and a second cable 733$_2$ connects one of the spectrometers 720$_B$ directly to the processor 730. The two other spectrometers 720$_A$ and 720$_C$ may be coupled to the processor 730 through the central spectrometer 720$_B$, which acts as a hub in a mesh network. While examples of star-like networks and mesh networks are illustrated, it is to be appreciated that any network configuration (e.g., ring, line, tree, bus, etc.) may be used in different embodiments.

Referring now to FIG. 7C, a plan view illustration of a diagnostic device 700 is shown, in accordance with an embodiment. As shown, the spectrometers 720 may be connected to the processor 730 in a daisy chain architecture with connectors 733 between each of the components. Again, here 720$_A$, 720$_B$, and 720$_C$ may be identical to etch other, with the only exception that the bus to 720$_C$ will need to be terminated.

Figure 8:
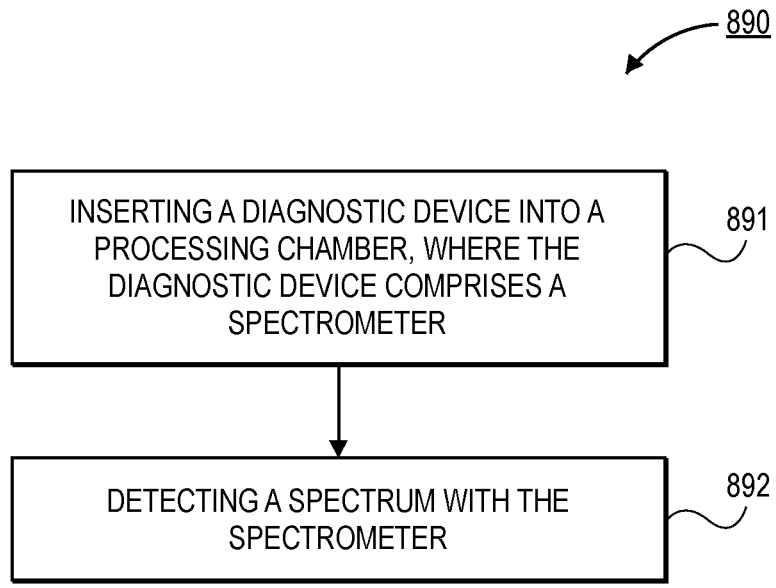
FIG. 8 is a process flow diagram of a process for detecting characteristics of an interior surface of a chamber, in accordance with an embodiment.

Referring now to FIG. 8, a process flow diagram of a process 890 for analyzing the interior surface of a chamber is shown, in accordance with an embodiment. In an embodiment, the process 890 begins with operation 891 which includes inserting a diagnostic device into a processing chamber. In an embodiment, the diagnostic device includes one or more spectrometers. In an embodiment, the diagnostic device may be substantially similar to any of the diagnostic devices described in greater detail above. For example, the diagnostic device may be integrated on a substrate with a wafer form factor or integrated on a robot arm.

In an embodiment, the process 890 may continue with operation 892, which comprises detecting a spectrum with the spectrometer. In some embodiments, detecting the spectrum may occur while the diagnostic device is laterally moved through the chamber. In other embodiments, the spectrum may be detected when the diagnostic device is stationary. The spectrum (or spectrums) detected by the one or more spectrometers may be used (e.g., by a processor) to determine material compositions, material thicknesses, etc. of one or more layers on an interior surface of the chamber.

Figure 9:
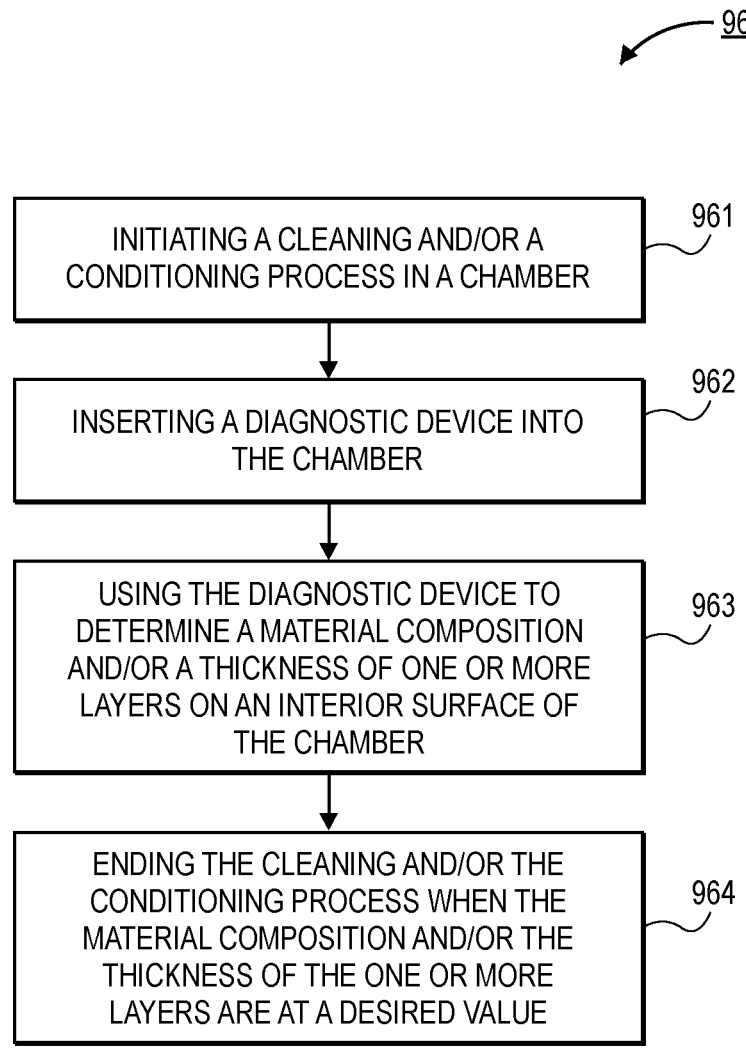
FIG. 9 is a process flow diagram of a process for monitoring a cleaning and/or conditioning process in a processing chamber, in accordance with an embodiment.

Referring now to FIG. 9, a process flow diagram of a process 960 is shown, in accordance with an embodiment. In an embodiment, the process 960 may begin with operation 961, which comprises initiating a cleaning and/or conditioning process in the chamber. A cleaning process may be periodically implemented in order to remove one or more layers of buildup material on the interior surfaces of the chamber. A conditioning process may be used to add or refine a layer on the bare surface of the chamber.

In an embodiment, process 960 continues with operation 962, which comprises inserting a diagnostic device into the chamber. In an embodiment, the diagnostic device may be similar to any of the diagnostic devices described in greater detail herein. For example, the diagnostic device may be integrated on a substrate with a wafer form factor, or integrated as part of the robot arm.

In an embodiment, process 960 may continue with operation 963, which comprises using the diagnostic device to determine a material composition and/or thickness of one or more layers on an interior surface of the chamber. For example, process 963 may include laterally displacing the diagnostic device through the chamber. In other embodiments, a measurement may be provided while the diagnostic device is stationary.

In an embodiment, process 960 may continue with operation 964, which comprises ending the cleaning and/or the conditioning process when the material composition and/or the thickness of the one or more layers are at a desired value. The desired value may correspond to a chamber that is considered suitably clean to resume processing of wafers. In other embodiments, the desired value may correspond to a chamber that has obtained a desired conditioning or seasoning in order to start processing wafers.

Figure 10:
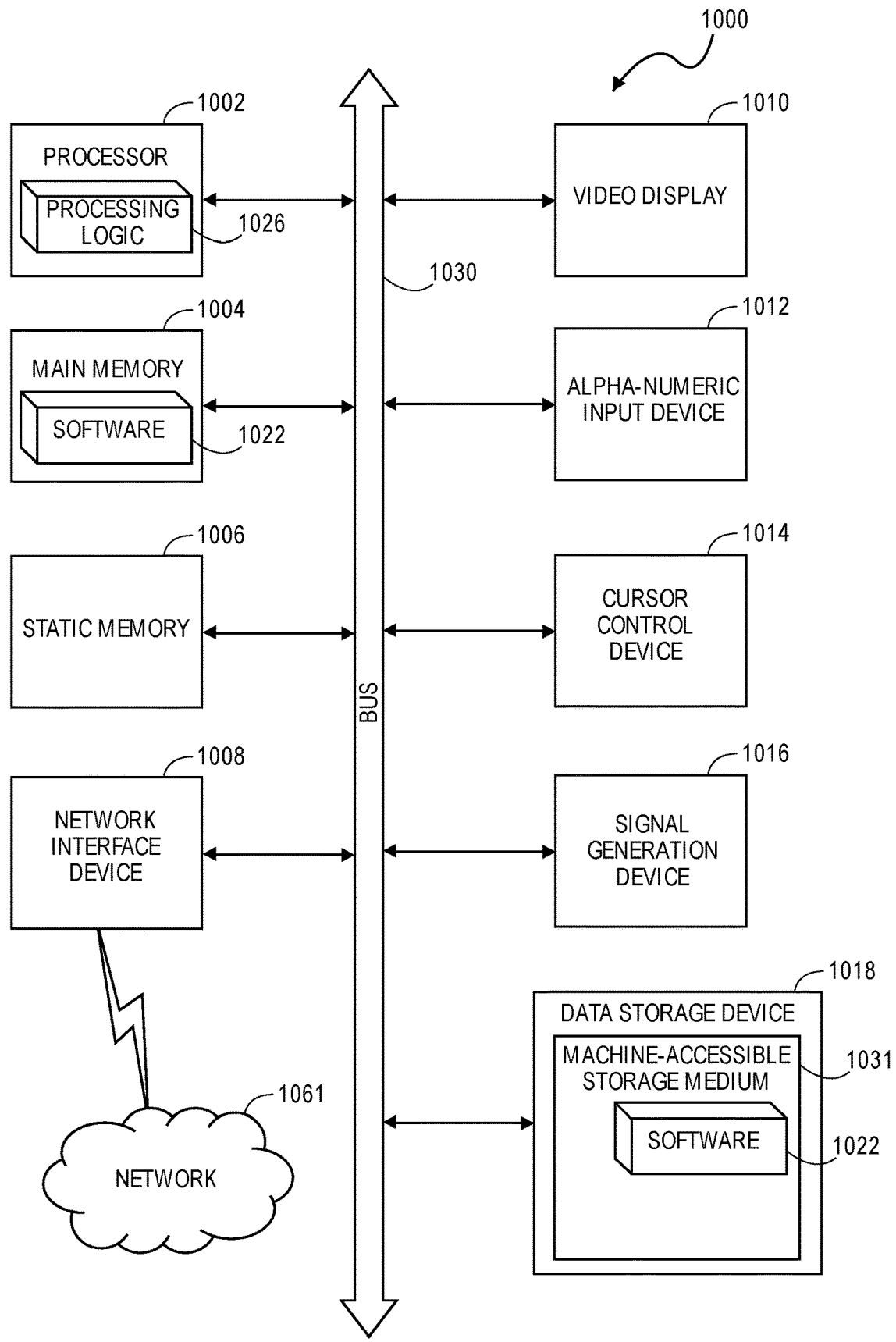
FIG. 10 illustrates a block diagram of an exemplary computer system that may be used in conjunction with a processing tool, in accordance with an embodiment.

Referring now to FIG. 10, a block diagram of an exemplary computer system 1000 of a processing tool is illustrated in accordance with an embodiment. In an embodiment, computer system 1000 is coupled to and controls processing in the processing tool. Computer system 1000 may be connected (e.g., networked) to other machines in a Local Area Network (LAN), an intranet, an extranet, or the Internet. Computer system 1000 may operate in the capacity of a server or a client machine in a client-server network environment, or as a peer machine in a peer-to-peer (or distributed) network environment. Computer system 1000 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1000, the term "machine" shall also be taken to include any collection of machines (e.g., computers) that individually or jointly execute a set (or multiple sets) of instructions to perform any one or more of the methodologies described herein.

Computer system 1000 may include a computer program product, or software 1022, having a non-transitory machine-readable medium having stored thereon instructions, which may be used to program computer system 1000 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1000 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1000 may further include a system network interface device 1008 for communicating with other devices or machines. The computer system 1000 may also include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium 1032 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1000, the main memory 1004 and the system processor 1002 also constituting machine-readable storage media. The software 1022 may further be transmitted or received over a network 1020 via the system network interface device 1008. In an embodiment, the network interface device 1008 may operate using RF coupling, optical coupling, acoustic coupling, or inductive coupling.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A diagnostic substrate, comprising:
   a substrate;
   a circuit board on the substrate;
   a plurality of spectrometers coupled to the circuit board; and
   a processor on the circuit board and communicatively coupled to the plurality of spectrometers, wherein the processor is encircled by the plurality of spectrometers.

2. The diagnostic substrate of claim 1, wherein each one of the plurality of spectrometers is oriented to face up, down, or sideways away from the substrate.

3. The diagnostic substrate of claim 1, wherein the substrate has a form factor of a semiconductor wafer, wherein a diameter of the substrate is 200 mm or 300 mm, and wherein a thickness of the substrate is 1 mm.

4. The diagnostic substrate of claim 1, further comprising:
   a light source.

5. The diagnostic substrate of claim 4, wherein the light source is configured to emit light, and wherein the emitted light is reflected back to one of the plurality of spectrometers.

6. The diagnostic substrate of claim 4, further comprising:
   a plurality of light sources, wherein each of the plurality of light sources are configured to be optically coupled to the one of the plurality of spectrometers, and wherein the plurality of light sources are configured to reflect light off of different areas of a chamber interior.

7. The diagnostic substrate of claim 4, further comprising a plurality of light sources, wherein the plurality of spectrometers are coupled in a daisy-chain configuration, a mesh configuration, or a star configuration.

8. The diagnostic substrate of claim 4, wherein the light source is coupled to an optical waveguide, and wherein the optical waveguide is configured to feed emitted light to more than one spectrometer on the substrate.

9. The diagnostic substrate of claim 1, wherein the plurality of spectrometers is on the circuit board.

10. The diagnostic substrate of claim 9, wherein each of the plurality of spectrometers has a dedicated light source, or wherein the plurality of spectrometers share a common light source.

11. The diagnostic substrate of claim 1, wherein the spectrometer is a diffraction and/or a grating spectrometer, a photonic crystal and/or a filter spectrometer, a spectral imager spectrometer, or an interferometer based spectrometer.

* * * * *